US008853699B2

(12) United States Patent
Choi et al.

(10) Patent No.: US 8,853,699 B2
(45) Date of Patent: Oct. 7, 2014

(54) THIN FILM TRANSISTOR AND METHOD OF FORMING THE SAME

(75) Inventors: Seung-Ha Choi, Suwon-si (KR); Kyoung-Jae Chung, Seoul (KR); Young-Wook Lee, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 278 days.

(21) Appl. No.: 12/902,786

(22) Filed: Oct. 12, 2010

(65) Prior Publication Data

US 2011/0198603 A1 Aug. 18, 2011

(30) Foreign Application Priority Data

Feb. 12, 2010 (KR) .......................... 10-2010-0013611

(51) Int. Cl.
*H01L 29/10* (2006.01)
*H01L 29/423* (2006.01)
*H01L 29/786* (2006.01)
*H01L 27/12* (2006.01)
*H01L 29/66* (2006.01)

(52) U.S. Cl.
CPC ...... *H01L 29/7869* (2013.01); *H01L 29/42384* (2013.01); *H01L 27/1225* (2013.01); *H01L 29/66742* (2013.01); *H01L 27/1214* (2013.01)
USPC ........................................... 257/66; 438/151

(58) Field of Classification Search
CPC ............ H01L 27/1225; H01L 27/1214; H01L 29/7869; H01L 29/66742; H01L 29/42384
USPC ........................................... 257/66; 438/151
See application file for complete search history.

(56) References Cited

U.S. PATENT DOCUMENTS

| 6,855,954 | B1 | 2/2005 | Zhang |
| 2005/0153538 | A1 | 7/2005 | Tsai et al. |
| 2007/0161160 | A1* | 7/2007 | Chen .............................. 438/149 |
| 2009/0230390 | A1 | 9/2009 | Gosain et al. |
| 2010/0032664 | A1* | 2/2010 | Lee et al. ......................... 257/43 |
| 2010/0065837 | A1* | 3/2010 | Omura et al. .................... 257/43 |
| 2010/0127266 | A1* | 5/2010 | Saito et al. ....................... 257/59 |
| 2010/0136743 | A1* | 6/2010 | Akimoto et al. .............. 438/104 |

FOREIGN PATENT DOCUMENTS

| JP | 62-037935 | 2/1987 |
| JP | 02-284419 | 11/1990 |
| JP | 05-283374 | 10/1993 |
| JP | 09-018006 | 1/1997 |
| JP | 09-326493 | 12/1997 |

(Continued)

*Primary Examiner* — Shaun Campbell
(74) *Attorney, Agent, or Firm* — F. Chau & Associates, LLC

(57) ABSTRACT

Disclosed are a thin film transistor and a method of forming the thin film transistor, wherein the thin film transistor includes a gate electrode, an oxide semiconductor pattern, a first gate insulating layer pattern interposed between the gate electrode and the oxide semiconductor pattern, wherein the first gate insulating layer pattern has an island shape or has two portions of different thicknesses from each other, a source electrode and a drain electrode electrically connected to the oxide semiconductor pattern, wherein the source electrode and the drain electrode are separated from each other, and a first insulating layer pattern placed between the source electrode and drain electrode and the oxide semiconductor pattern, wherein the first insulating layer pattern partially contacts the source electrode and drain electrode and the first gate insulating layer pattern, and wherein the first insulating layer is enclosed by an outer portion.

24 Claims, 9 Drawing Sheets

(56) References Cited

FOREIGN PATENT DOCUMENTS

| | | |
|---|---|---|
| JP | 10-209458 | 8/1998 |
| JP | 2000-036491 | 2/2000 |
| JP | 2001-119029 | 4/2001 |
| JP | 2002-134756 | 5/2002 |
| JP | 2002539641 | 11/2002 |
| JP | 2003-031660 | 1/2003 |
| JP | 2007-298947 | 11/2007 |
| JP | 2009-224354 | 10/2009 |
| JP | 2009-272427 | 11/2009 |
| JP | 2010531538 | 9/2010 |
| WO | 00/55903 | 9/2000 |
| WO | 2008/109239 | 9/2008 |
| WO | 2009/136645 | 11/2009 |

* cited by examiner

THIN FILM TRANSISTOR AND METHOD OF FORMING THE SAME

CROSS-REFERENCE TO RELATED APPLICATION

This application claims priority to and the benefit of Korean Patent Application No. 10-2010-0013611 filed in the Korean Intellectual Property Office on Feb. 12, 2010, the entire contents of which are incorporated herein by reference.

BACKGROUND OF THE INVENTION (a) Technical Field

The present invention relates to a thin film transistor and a method of forming the thin film transistor, and more particularly, to an oxide semiconductor thin film transistor with improved reliability and a method of forming the thin film transistor.

(b) Discussion of the Related Art

A liquid crystal display includes a first substrate including a pixel electrode, a second substrate including a common electrode, and a liquid crystal layer interposed between the first substrate and the second substrate and having dielectric anisotropy.

An electric field is formed between the pixel electrode and the common electrode, and the intensity of the electric field is controlled to change the arrangement of liquid crystal molecules of the liquid crystal layer.

Accordingly, the retardation of light passing through the liquid crystal molecule is controlled, thereby displaying desired images.

A thin film transistor is used as a switching element for the liquid crystal display.

The thin film transistor (TFT) has a gate electrode, a drain electrode, a source electrode, and an active layer.

When the gate electrode is applied with a voltage of more than a predetermined value, the active layer is activated so that a current flows between the drain electrode and the source electrode.

As a material forming the active layer of the thin film transistor (TFT), amorphous silicon (a-Si) or polysilicon (p-Si) may be used.

Recently, the tendency toward large size and highly miniaturized TFT-LCDs has accelerated, and a next generation active layer for realization thereof is required.

Particularly, if high resolution and a driving technique are applied to the large size display, it is necessary to reduce wire resistance and parasitic capacitance and to improve the characteristics of the thin film transistor with regard to the driving of the panel.

For the improved performance of the thin film transistor, a micro-crystalline Si TFT or an oxide semiconductor is being actively researched as the next generation candidate.

However, the thin film transistor having the micro-crystalline Si has a channel region with low electron mobility, and deposition equipment must be developed.

The oxide semiconductor has electron mobility that is higher by several tens of times than the amorphous silicon thin film transistor such that the charging capacity of the pixel is good. Further, the oxide semiconductor allows a driving circuit to be integrated on the substrate. Because of the merits, the oxide semiconductor is being developed.

The thin film transistor including the oxide semiconductor may be electrically influenced by its structure and the processing conditions in the dry etching or wet etching process.

Accordingly, research related to element structure and a reliable process is required.

SUMMARY

Exemplary embodiments of the present invention provide an oxide semiconductor thin film transistor having improved reliability and a method of forming the oxide semiconductor thin film transistor.

A thin film transistor according to an exemplary embodiment of the present invention includes an insulating layer enclosed by an outer portion having a step shape on an oxide semiconductor pattern.

A thin film transistor according to an exemplary embodiment of the present invention includes: a gate electrode; an oxide semiconductor pattern; a first gate insulating layer pattern interposed between the gate electrode and the oxide semiconductor pattern, wherein the first gate insulating layer pattern has an island shape or has two portions of different thicknesses from each other; a source electrode and a drain electrode electrically connected to the oxide semiconductor pattern, wherein the source electrode and the drain electrode are separated from each other; and a first insulating layer pattern placed between the source electrode and drain electrode and the oxide semiconductor pattern, wherein the first insulating layer pattern partially contacts the source electrode and drain electrode and the first gate insulating layer pattern, and wherein the first insulating layer pattern is enclosed by an outer portion.

The outer portion may have a step shape may include a layer made of a high-molecule compound including carbon.

The first gate insulating layer pattern and the first insulating layer pattern may have the same material.

A method of forming a thin film transistor according to an exemplary embodiment of the present invention includes forming an insulating layer enclosed by an outer portion having a step shape on an oxide semiconductor pattern.

A method of forming a thin film transistor according to an exemplary embodiment of the present invention includes: forming a gate electrode; forming a first gate insulating layer on the gate electrode; forming an oxide semiconductor pattern on the first gate insulating layer; forming a first insulating layer pattern on the oxide semiconductor pattern, wherein the first insulating layer pattern partially contacts the first gate insulating layer; continuously patterning the first gate insulating layer to form a first gate insulating layer pattern having an island shape or having two portions having different thicknesses; partially etching the first insulating layer pattern to form a second insulating layer pattern enclosed by an outer portion having a step shape; and forming a source electrode and a drain electrode electrically connected to the oxide semiconductor pattern, wherein the source electrode and the drain electrode partially contact the second insulating layer pattern, and wherein the source electrode and the drain electrode are separated from each other.

Partially etching the first insulating layer pattern to form the second insulating layer pattern enclosed by the outer portion may include removing a high-molecule compound formed on the surface of the first insulating layer pattern, wherein the high-molecule compound includes carbon, partially etching the first insulating layer pattern from which the high-molecule compound is removed, and forming a high-molecule compound including carbon on the outer portion.

Forming the first insulating layer pattern, the second insulating layer pattern, and the first gate insulating layer pattern may include using a halogen-carbon compound and oxygen gas as a main gas in an etching process.

According to an exemplary embodiment of the present invention, the insulating layer enclosed by the outer portion is formed on an oxide semiconductor pattern such that the reliability of the oxide semiconductor thin film transistor may be improved.

DETAILED DESCRIPTION OF THE EMBODIMENTS

Figure 1:
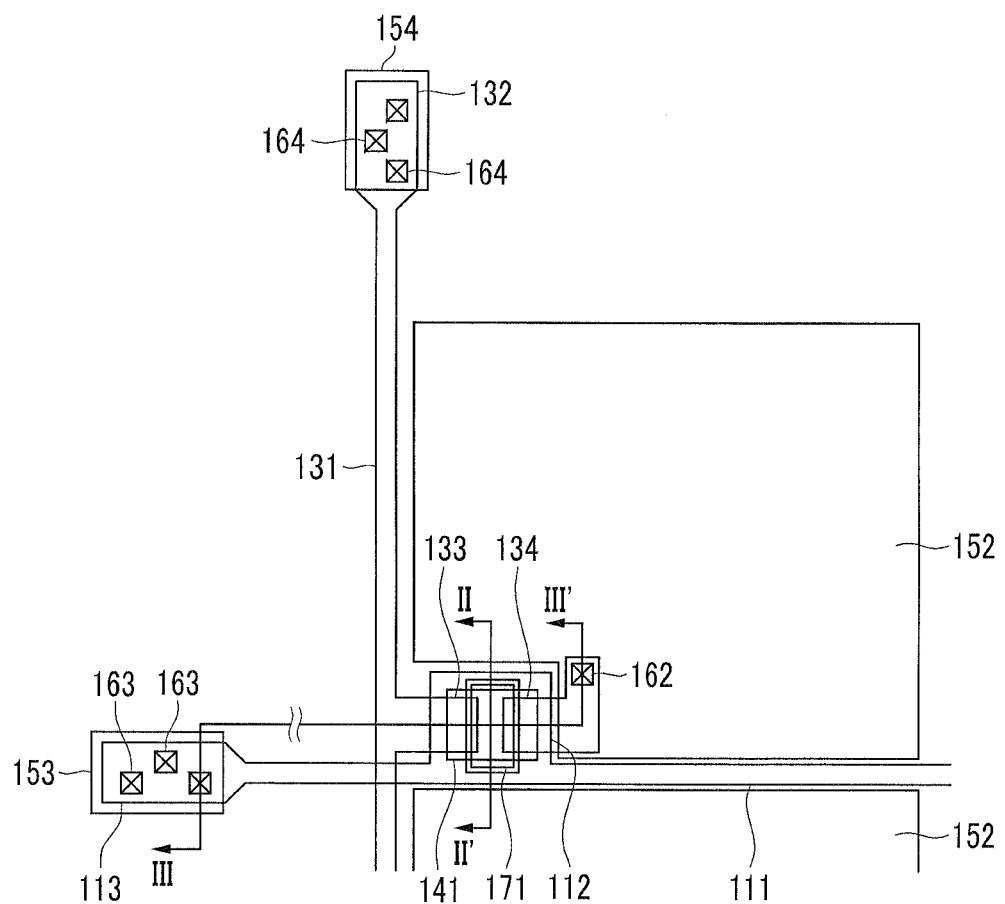
FIG. 1 is a layout view of an oxide semiconductor thin film transistor substrate according to an exemplary embodiment of the present invention.

Hereinafter, referring to the drawings, exemplary embodiments of the present invention will be described in detail.

However, the present invention is not limited to the exemplary embodiments disclosed below and may be implemented in various forms. It will be appreciated by those skilled in the art that changes may be made in these embodiments without departing from the principles and spirit of the general inventive concept, the scope of which is defined in the appended claims and their equivalents.

The same reference numerals may designate the same or similar elements throughout the specification and the drawings.

Figure 2:
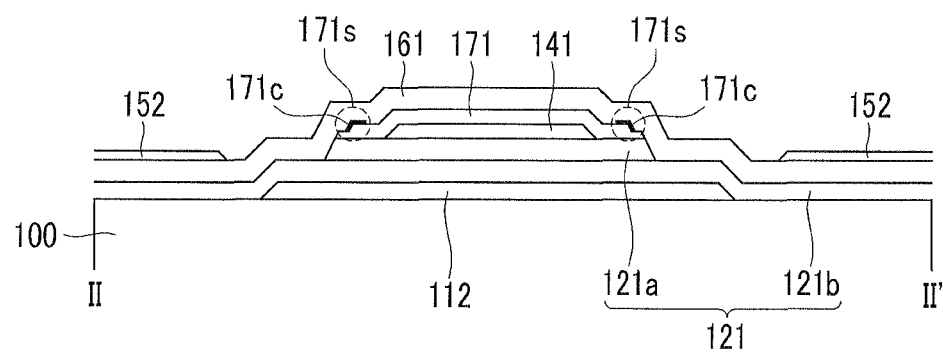
FIG. 2 to FIG. 3 are cross-sectional views taken along the lines and of FIG. 1, respectively.
Figure 3:
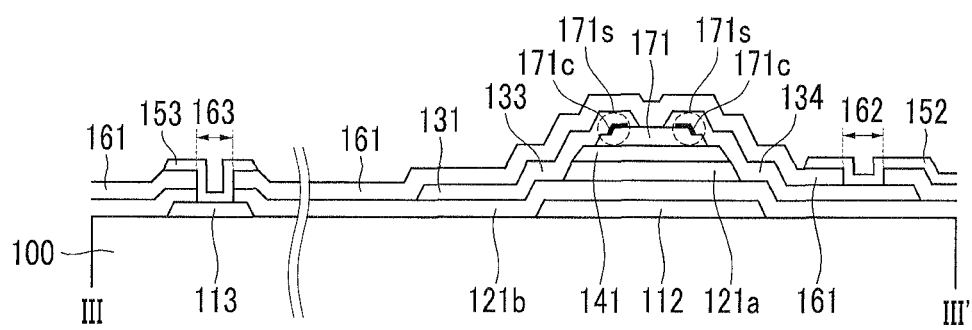

FIG. 1 is a layout view of an oxide semiconductor thin film transistor substrate according to an exemplary embodiment of the present invention, and FIG. 2 and FIG. 3 are cross-sectional views taken along the lines II-II' and III-III' of FIG. 1, respectively.

Referring to FIG. 1, FIG. 2, and FIG. 3, a gate line 111, a data line 131, and a thin film transistor are formed on a substrate 100.

The substrate 100 may be a substrate on which an insulating layer, such as a transparent glass layer or a transparent plastic layer, is formed.

The gate line 111 includes a gate electrode 112 and a gate pad 113.

The gate line 111 may include at least one material of aluminum (Al), copper (Cu), molybdenum (Mo), neodymium (Nd), titanium (Ti), platinum (Pt), silver (Ag), niobium (Nb), chrome (Cr), manganese (Mn), tungsten (W), or tantalum (Ta), and may be made in a single layer or a multi-layered structure.

The gate electrode 112 and the gate pad 113 may be formed with different layers through different processes.

A gate insulating layer 121 is formed on the substrate 100 and the gate line 111.

The gate insulating layer 121 includes a first gate insulating layer pattern 121a and a second gate insulating layer 121b.

The second gate insulating layer 121b contacts the gate line 111, and the first gate insulating layer pattern 121a contacts an oxide semiconductor pattern 141.

The second gate insulating layer 121b has a thickness of more than 1000 Å.

The first gate insulating layer pattern 121a may have an island pattern or a pattern (not shown) having different thicknesses.

Also, the first gate insulating layer pattern 121a may include a relatively smaller amount of hydrogen than the second gate insulating layer 121b, and the second gate insulating layer 121b may have a larger dielectric ratio than that of the first gate insulating layer pattern 121a.

The first gate insulating layer pattern 121a may be a denser layer than the second gate insulating layer 121b.

For example, the first gate insulating layer pattern 121a and the second gate insulating layer 121b may include at least one material of SiOx, SiNx, and SiONx, or carbon and at least one of SiOx, SiNx, and SiONx.

In consideration of processing efficiency, the second gate insulating layer 121b may be formed faster than the first gate insulating layer pattern 121a, and thereby the second gate insulating layer 121b may have a sparse layer characteristic.

In detail, the first gate insulating layer pattern 121a may be made of silicon oxide (SiOx), and the second gate insulating layer 121b may be made of silicon nitride (SiNx).

The oxide semiconductor pattern 141 is disposed on the gate insulating layer 121.

The oxide semiconductor pattern 141 includes oxygen (O) and at least one of gallium (Ga), indium (In), zinc (Zn), tin (Sn), tantalum (Ta), titanium (Ti), chrome (Cr), hafnium (Hf), yttrium (Y), iron (Fe), ruthenium (Ru), cadmium (Cd), lithium (Li), beryllium (Be), natrium (Na), magnesium (Mg), vanadium (V), zirconium (Zr), niobium (Nb), scandium (Sc), tungsten (W), manganese (Mn), nickel (Ni), palladium (Pd), copper (Cu), boron (B), aluminum (Al), germanium (Ge), silicon (Si), carbon (C), nitrogen (N), phosphorous (P), and fluorine (F).

Examples of the oxide semiconductors including at least one of the above-described materials may include ZnO, In—Ga—Zn—O, Zn—In—O, Zn—Sn—O, In—Zn—Hf—O, Sn—In—O, Sn—O, and Zn—Sn—Hf—O.

The oxide semiconductor pattern 141 may include amorphous silicon, micro-crystallized silicon, single crystallized silicon, or mixtures thereof.

The thin film transistor including the oxide semiconductor may have electric field effect mobility that is larger by several times to several hundred times than that of the thin film transistor including the hydrogenated amorphous silicon (a-Si:H).

Particularly, ZnO may theoretically obtain a maximum of 200 cm$^2$/Vs, and this value corresponds to the electric field effect mobility of polysilicon (p-Si).

Also, although the thin film transistor (TFT) including the oxide semiconductor is exposed to visible rays, leakage current is small, differently from the thin film transistor including the amorphous silicon (a-Si), and thereby afterimages of the display device may be reduced.

In addition, the deposition of the oxide semiconductor layer may be performed at a low temperature so that the oxide semiconductor layer may be applied to a plastic substrate or a soda lime substrate.

An insulating layer pattern 171 is disposed on the oxide semiconductor pattern 141 as an etch stopper.

The thickness of the insulating layer pattern 171 is less than 3000 Å, and may be made of an inorganic layer including at least one material of SiOx, SiNx, SiOCx, and SiONx, and an organic layer including an organic material or an organic polymer material.

The insulating layer pattern 171 may be made of the same material as the first gate insulating layer pattern 121a.

For example, the insulating layer pattern 171 may be made of silicon oxide (SiOx).

The insulating layer pattern 171 is enclosed by an outer portion 171s having a step shape, wherein the outer portion 171s may further include a high-molecule compound layer 171c partially including carbon.

The outer portion 171s of the step shape allows a source/drain electrode that is to be formed later to have uniform step coverage.

The insulating layer pattern 171 as an etch stopper is an insulating layer contacting the oxide semiconductor like the first gate insulating layer pattern 121a. According to an embodiment, an insulating layer formed by using hydrogen as a main gas is not used if possible.

Also, the insulating layer is a dense layer for preventing hydrogen from being diffused into the oxide semiconductor from outside the insulating layer.

Hydrogen diffused into the oxide semiconductor is combined with oxygen in the oxide semiconductor so that the oxide semiconductor is changed into a conductive metal, and accordingly hydrogen needs to be prevented from being diffused into the oxide semiconductor while forming the oxide semiconductor thin film transistor.

The insulating layer pattern 171 is wider than the oxide semiconductor pattern 141 such that insulating layer pattern 171 partially contacts the first gate insulating layer pattern 121a at both sides of the oxide semiconductor pattern 141. Accordingly, the portion of the oxide semiconductor pattern 141 forming the channel of the thin film transistor is completely covered and protected by the insulating layer pattern 171.

A data line 131 and a source electrode 134 are formed on the oxide semiconductor pattern 141, the insulating layer pattern 171, and the gate insulating layer 121.

The data line 131 includes a data pad 132 and a drain electrode 133.

The drain electrode 133 and the source electrode 134 are disposed on the insulating layer pattern 171 as an etch stopper, and are separated from each other.

Here, the influence on the oxide semiconductor pattern 141 may be minimized by the underlying insulating layer pattern 171 in the electrode formation process.

The data pad 132 is connected to an external driving circuit (not shown), thereby receiving a data driving signal, and the drain electrode 133 transmits the data signal from the data line 131 to the oxide semiconductor pattern 141.

The data line 131 includes at least one of Al, Cu, Mo, Nd, Ti, Pt, Ag, Nb, Cr, Mn, W, and Ta, and may be a single layer or a multilayer structure.

The data pad 132 and the drain electrode 133 may be separated from the data line 131, and formed of a different layer from the data line 131, and may be made of a different material from the data line 131.

A protecting insulating layer 161 is placed on the data line 131 and the insulating layer pattern 171 as an etch stopper.

The protecting insulating layer 161 may be made of an inorganic material layer including at least one of SiOx, SiNx, and SiONx or an organic layer including an organic material or a high-molecule organic material.

Also, the protecting insulating layer 161 may have a multilayer structure including the organic layer and the inorganic layer.

The protecting insulating layer 161 includes a plurality of contact holes.

The protecting insulating layer 161 patterned by photolithography has a first contact hole 162 exposing the source electrode 134, and second and third contact holes 163 and 164, respectively, exposing the gate pad 113 and the data pad 132.

The protecting insulating layer 161 may be omitted.

A pixel electrode 152 and assistance pads 153 and 154 are formed on the protecting insulating layer 161.

The pixel electrode 152 may be a transparent conductive layer having an amorphous, crystallized, or partial amorphous structure.

For example, the transparent conductive layer may be a-ITO (amorphous indium tin oxide) or IZO (amorphous indium zinc oxide) or ITO.

Also, the pixel electrode 152 may include O and at least one of Ga, In, Zn, Sn, Ta, Ti, Cr, Hf, Y, Fe, Ru, Cd, Li Be, Na, Mg, V, Zr, Nb, Sc, W, Mn, Fe, Ni, Pd, Cu, B, Al, Ge, Si, C, N, P, and F.

The pixel electrode 152 is electrically connected to the source electrode 134 through the first contact hole 162, and the assistance pads 153 and 154 are electrically connected to the gate pad 113 and the data pad 132 through the second and third contact holes 163 and 164, respectively.

Accordingly, the data signal transmitted to the assistance pad 154 of the data pad 132 from an external source may be transmitted to the oxide semiconductor pattern 141 through the drain electrode 133.

The data signal transmitted to the oxide semiconductor pattern 141 is transmitted to the source electrode 134 according to the kind of the electrical signal applied to the gate electrode 112, and is transmitted to the pixel electrode 152 connected to the source electrode 134.

When the thin film transistor according to an embodiment of the present invention is applied to the liquid crystal display, the data signal transmitted to the pixel electrode 152 may be applied to the liquid crystal layer.

FIG. 4 to FIG. 14 are layout views and cross-sectional views showing a method of forming the oxide semiconductor thin film transistor of FIG. 1 according to an exemplary embodiment of the present invention.

Figure 4:
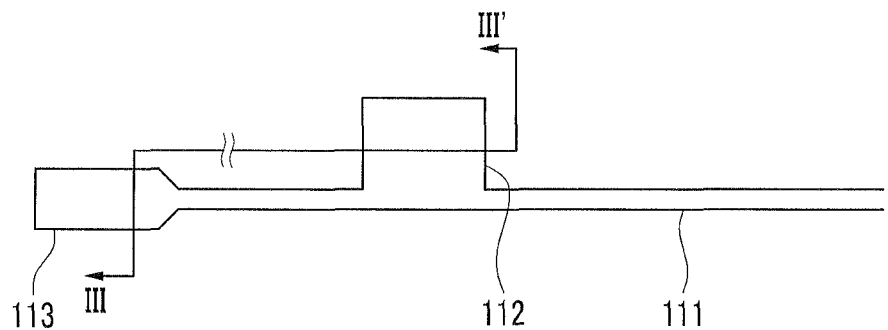
FIG. 4 to FIG. 14 are layout views and cross-sectional views showing a method of forming the oxide semiconductor thin film transistor of FIG. 1 according to an exemplary embodiment of the present invention.
Figure 5:
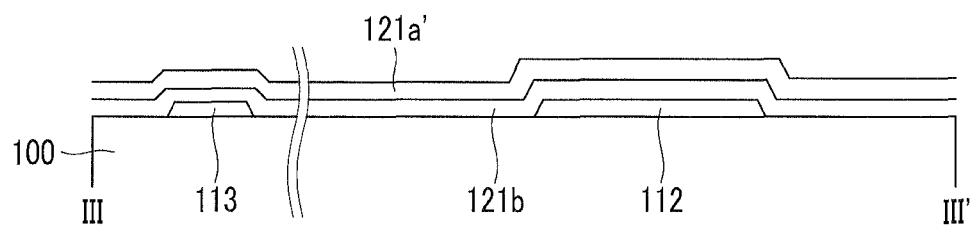

FIG. 4 is a layout view showing a gate line 111 according to an exemplary embodiment of the present invention, and FIG. 5 is a cross-sectional view taken along the line III-III' of FIG. 4 and explaining a method for forming an oxide semiconductor thin film transistor.

Referring to FIG. 4 and FIG. 5, a conductive material is formed on a substrate 100, and is patterned by a photolithography process to form a gate line 111 including a gate electrode 112 and a gate pad 113.

The gate electrode 112 protrudes from the gate line 111, and the gate pad 113 receiving a driving signal from an external driving circuit (not shown) is formed at the end of the gate line 111.

Alternatively, the gate electrode may be a portion extending straight from the gate line extending straight, for example parallel to an extension direction of the gate line.

A gate insulating layer 121 of a multi-layered structure is deposited on the gate line 111 by a physical vapor deposition method, such as a chemical vapor deposition method or a sputtering method.

Here, the gate insulating layer may be deposited as an etch stopper by a reactive sputtering method.

The gate insulating layer includes a first gate insulating layer 121a' and a second gate insulating layer 121b, wherein the second gate insulating layer 121b is a silicon nitride layer, and the first gate insulating layer 121a' is a silicon oxide layer.

Ammonium ($NH_3$) gas is used in the process of forming the silicon nitride layer (SiNx), such that hydrogen remains in the silicon nitride layer rather than the process of forming the silicon oxide layer (SiOx) using nitrous oxide ($N_2O$), where hydrogen may be diffused into the oxide semiconductor or easily combined with the oxide semiconductor.

Figure 6:
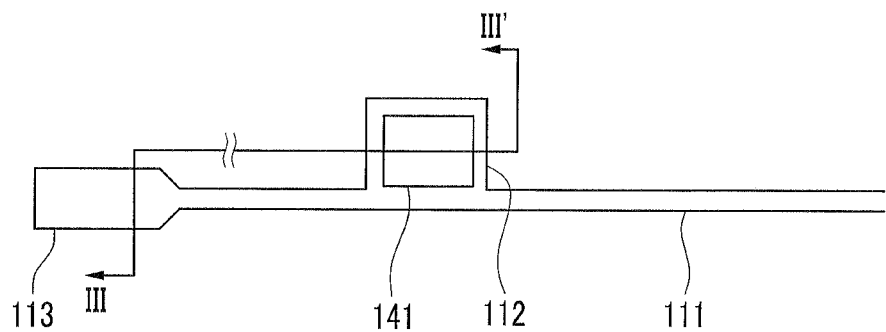
Figure 7:
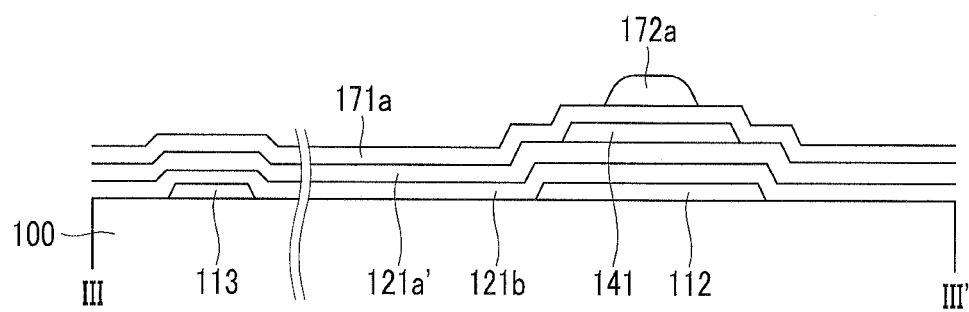

FIG. 6 is a layout view of an oxide semiconductor pattern 141 according to an exemplary embodiment of the present invention, and FIG. 7 is a cross-sectional view taken along the line III-III' of FIG. 6 and explaining the method of forming the oxide semiconductor thin film transistor.

Referring to FIG. 6 and FIG. 7, an oxide semiconductor layer is continuously or discontinuously deposited on the gate insulating layer 121 through a physical vapor deposition method, such as a chemical vapor deposition method or a sputtering method.

Next, the oxide semiconductor layer is patterned by a photolithography process to form an oxide semiconductor pattern 141.

Next, an insulating layer 171a is deposited as the etch stopper on the oxide semiconductor pattern 141 through a physical vapor deposition method, such as a chemical vapor deposition method or a sputtering method.

Here, the insulating layer 171a as the etch stopper may be deposited by a reactive sputtering method.

In detail, the insulating layer 171a may be formed of a silicon oxide layer like the first gate insulating layer pattern 121a.

Here, a photoresist layer is coated on the insulating layer 171a of the etch stopper layer.

The photoresist may be a positive photoresist including a PAG (photoacid generator), or a negative photoresist including a PAC (photoactive crosslinker).

The photoresist is exposed and developed by using an optical mask to form a first photoresist pattern 172a.

Figure 8:
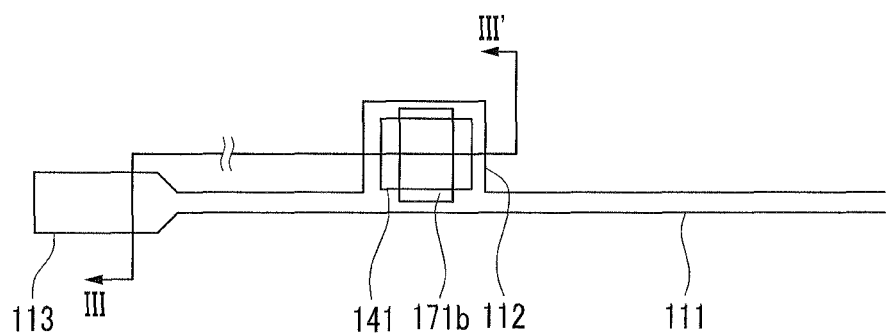
Figure 9:
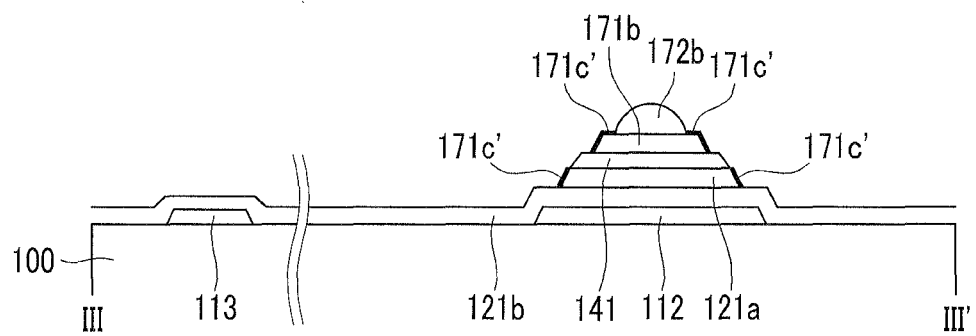
Figure 10:
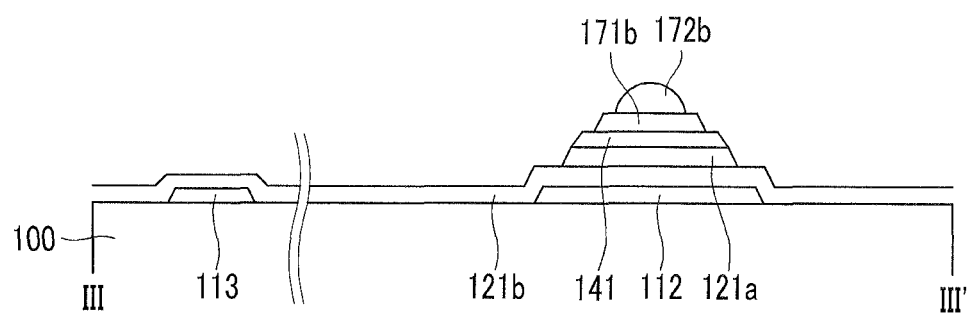

FIG. 8 is a layout view showing an insulating layer pattern 171b as an etch stopper according to an exemplary embodiment of the present invention, and FIG. 9 and FIG. 10 are cross-sectional views taken along the line of FIG. 8, explaining a method of forming the oxide semiconductor thin film transistor.

Referring to FIG. 8 and FIG. 9, the insulating layer 171a of the etch stopper is etched by using the first photoresist pattern 172a as an etching mask.

Here, the etching process may be dry etching, and is executed under processing conditions where there is sufficient etching selectivity so that the oxide semiconductor pattern 141 is not etched.

The insulating layer 171a and the first gate insulating layer 121a' are formed of the same silicon oxide layer, such that the insulating layer pattern 171b as the etch stopper and the first gate insulating layer pattern 121a may be continuously formed.

The first gate insulating layer pattern 121a may have an island pattern, or a pattern having two portions with different thicknesses.

For example, the two portions with different thicknesses may include a portion having a first thickness equal to a thickness initially formed under the oxide semiconductor pattern 141 and a portion having a second thickness that is thinner than the first thickness.

The first gate insulating layer pattern 121a is formed by using the first photoresist pattern 172a like the insulating layer pattern 171b as the etch stopper, such that the first gate insulating layer pattern 121a has substantially the same pattern as the insulating layer pattern 171b in the region where the oxide semiconductor pattern 141 is not located.

Also, the first photoresist pattern 172a is partially removed by an etching gas, and is thereby changed into the second photoresist pattern 172b.

The etching process uses a halogen-carbon compound, such as CFx or $C_4F_8$, and oxygen gas as the main gas, and may be executed with reactive ion etch ("RIE") equipment.

According to the etching speed, a halogen-sulfur compound, such as SFx or $SF_6$, as the main gas may be further included, and according to an embodiment, the amount of the halogen-sulfur compound may be 20% less than the amount of halogen carbon-compound and oxygen gas.

The halogen sulfur compound can quickly etch the silicon oxide layer and the silicon nitride layer, such that increasing the amount of the halogen sulfur-compound may damage the second gate insulating layer 121b. Accordingly, the amount of the halogen-sulfur compound is determined to be less than 20%.

When etching by using the halogen-carbon compound as the main gas, the side surface of an object that is etched and the first photoresist pattern 172a are partially removed such that a high-molecule compound layer 171c' including carbon may be formed on the exposed surface of the object.

Due to the high-molecule compound layer 171c', the etched object has an inclined surface with a steep inclination.

This steep inclination surface may deteriorate the coverage while subsequently forming other layers.

Referring to FIG. 8 and FIG. 10, the high-molecule compound layer 171c' formed on the etching inclination surface is removed.

The high-molecule compound layer 171c' is removed through a dry etching process using an inert gas and oxygen gas as the main gas.

Figure 11:
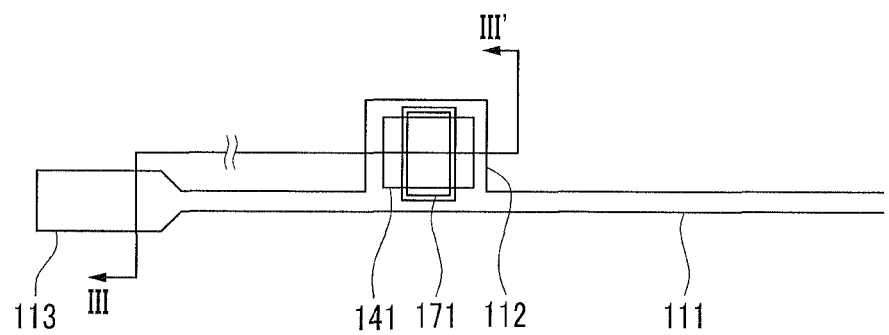
Figure 12:
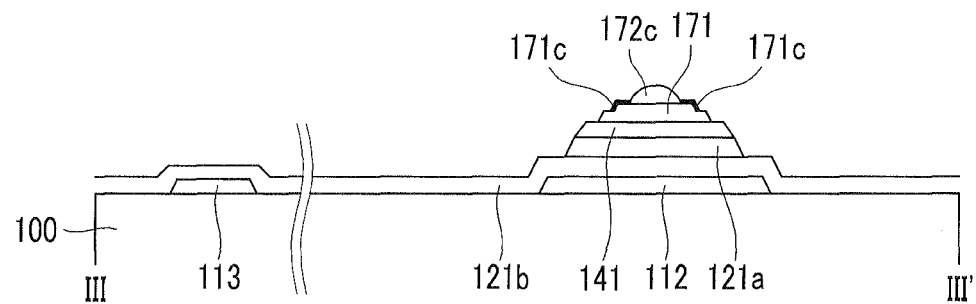

FIG. 11 is a layout view of the insulating layer pattern 171 as an etch stopper according to an exemplary embodiment of the present invention, and FIG. 12 is a cross-sectional view taken along the line III-III' of FIG. 11, explaining a method of forming the oxide semiconductor thin film transistor.

Referring to FIG. 11 and FIG. 12, after removing the high-molecule compound layer 171c', the outer portion of the insulating layer pattern 171b as the etch stopper is etched to form an insulating layer pattern 171 enclosed by the outer portion of a step shape.

The etching process uses a halogen-carbon compound, such as CFx or $C_4F_8$, and oxygen gas as the main gas, and may be executed with reactive ion etch ("RIE") equipment.

The halogen-carbon compound, which has an amount equal to or more than the amount of oxygen gas, is supplied for the etching process.

When the amount of halogen-carbon compound is equal to or less than that of oxygen gas, the etching selectivity between the silicon oxide layer and the silicon nitride layer is decreased, and as a result, the second gate insulating layer 121b may be over-etched.

The etching time of the etching process is controlled to partially etch the outer portion of the insulating layer pattern 171b.

In addition, as described in connection with FIG. 9, the second photoresist pattern 172b is partially removed by an etching gas, and is thereby being changed into the third photoresist pattern 172c.

Also, when etching by using the halogen-carbon compound as the main gas, the side surface of an object that is etched and the second photoresist pattern 172b are partially removed such that the high-molecule compound layer 171c including carbon may be again formed on the exposed surface of the object.

As such, the insulating layer pattern 171 having the step shape is formed, thereby smoothing the steep inclination.

Accordingly, the deterioration of the step coverage that may be generated when subsequently forming the source/drain electrode may be alleviated such that a reliable element may be produced.

Figure 13:
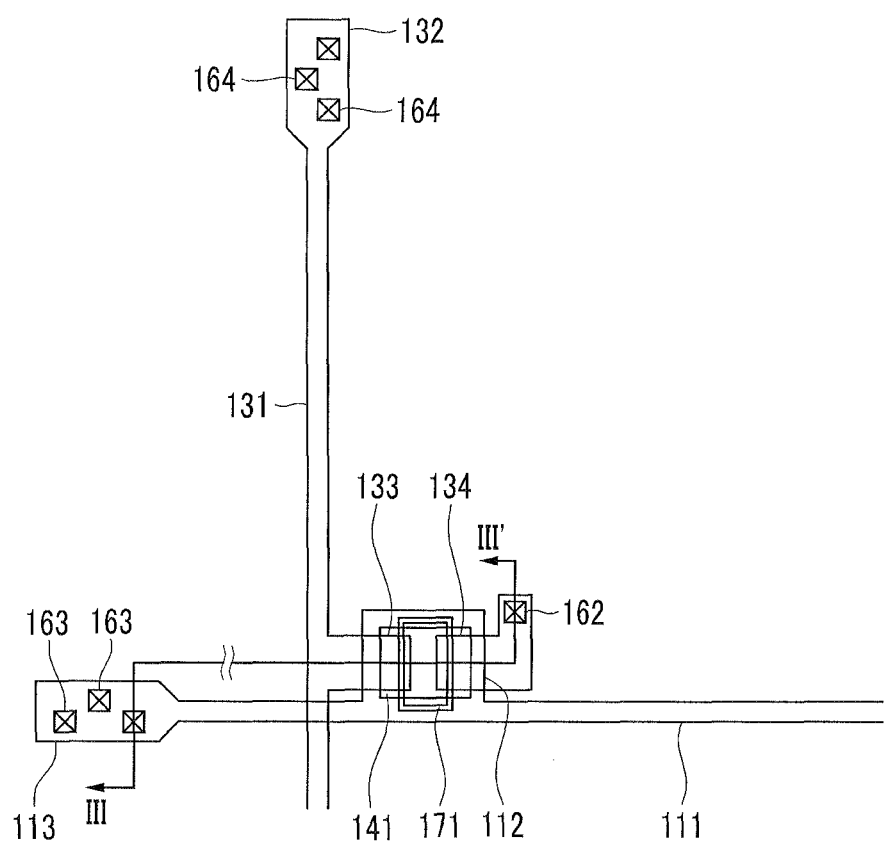
Figure 14:
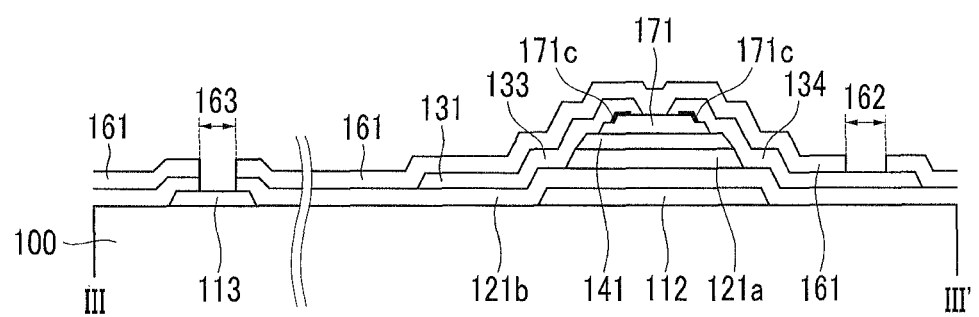

FIG. 13 is a layout view showing a data line 131 according to an exemplary embodiment of the present invention, and FIG. 14 is a cross-sectional view taken along the line III-III' of FIG. 13, explaining a method of forming the oxide semiconductor thin film transistor.

Referring to FIG. 13 and FIG. 14, a data line layer is formed on the second gate insulating layer 121b and the insulating layer pattern 171 as the etch stopper by a physical vapor deposition method, such as a chemical vapor deposition method or sputtering method.

Next, through a photolithography process, the data line 131 and the source electrode 134 are formed, and the data line 131 and the source electrode 134 contact the oxide semiconductor pattern and the insulating layer pattern 171.

A dummy pattern (not shown) made of oxide semiconductor to reduce the step generated by the gate line 111 may be placed in the region where the data line 131 and the gate line 111 intersect.

A protecting insulating layer 161 is deposited on the data line 131 and the insulating layer pattern 171 of the etch stopper.

The thickness of the protecting insulating layer 161 may be in the range of 1000 Å to 20,000 Å.

The protecting insulating layer 161 may be deposited through a physical vapor deposition method, such as a chemical vapor deposition method or sputtering method.

Next, the protecting insulating layer 161 is etched through a photolithography process to form the first to third contact holes 162, 163, and 164.

The first contact hole 162 exposes the upper surface of the source electrode 134, and the second contact hole 163 and the third contact hole 164 expose the upper surfaces of the gate pad 113 and the data pad 132, respectively.

Next, a transparent conductive layer (not shown) is deposited on the protecting insulating layer 160 including the first to third contact holes 162, 163, and 164.

The thickness of the transparent conductive layer may be in the range of 100 Å to 500 Å.

The transparent conductive layer may be deposited through a physical vapor deposition method, such as a chemical vapor deposition method or sputtering method.

Next, the transparent conductive layer is patterned through a photolithography process to form a pixel electrode 152 and assistance pads 153 and 154 as shown in FIG. 1 to FIG. 3.

According to an exemplary embodiment of the present invention, the gate insulating layer 121 is formed in the multi-layered structure, and the first gate insulating layer pattern 121a and the insulating layer pattern 171 that contact the oxide semiconductor pattern are formed so that little or no hydrogen is included in the main gas, thereby improving the reliability of an element.

Also, the insulating layer pattern 171 of the etch stopper includes the outer portion 171s having the step shape such that the uniform step coverage may be obtained in the subsequent process.

Through this structure, the reliability of the element may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor comprising:
    a gate electrode;
    an oxide semiconductor pattern;
    a first gate insulating layer pattern between the gate electrode and the oxide semiconductor pattern
    a source electrode and a drain electrode electrically connected to the oxide semiconductor pattern, wherein the source electrode and the drain electrode are separated from each other; and
    a first insulating layer pattern between the source electrode and the drain electrode, and the oxide semiconductor pattern, wherein the first insulating layer pattern partially contacts the source electrode and drain electrode and the first gate insulating layer pattern, and wherein the first insulating layer pattern is enclosed by an outer portion, wherein the outer portion includes a first step and a second step on the first step, and wherein the first and second steps positioned on the oxide semiconductor pattern are covered by the source and drain electrodes and wherein the first insulating layer pattern contacts a top surface of the oxide semiconductor pattern.

2. The thin film transistor of claim 1, wherein the outer portion includes a layer comprising a high-molecule compound including carbon.

3. The thin film transistor of claim 1, wherein the first gate insulating layer pattern is a silicon oxide layer.

4. The thin film transistor of claim 3, wherein the gate electrode and the oxide semiconductor are separated from each other by a distance of more than at least 1000 Å.

5. The thin film transistor of claim 3, wherein the first insulating layer pattern is a silicon oxide layer.

6. The thin film transistor of claim 5, wherein a thickness of the first insulating layer is less than 3000 Å.

7. The thin film transistor of claim 5, wherein the outer portion includes a layer made of a high-molecule compound including carbon.

8. The thin film transistor of claim 1, further comprising:
    a second gate insulating layer between the gate electrode and the oxide semiconductor pattern.

9. The thin film transistor of claim 8, wherein the second gate insulating layer contacts the gate electrode, and wherein the second gate insulating layer is a silicon nitride layer.

10. The thin film transistor of claim 9, wherein a thickness of the second gate insulating layer is more than 1000 Å.

11. A method for forming a thin film transistor comprising:
    forming a gate electrode;
    forming a first gate insulating layer on the gate electrode;
    forming an oxide semiconductor pattern on the first gate insulating layer;
    forming a first insulating layer pattern on the oxide semiconductor pattern, wherein the first insulating layer pattern partially contacts the first gate insulating layer;
    continuously patterning the first gate insulating layer to form a first gate insulating layer pattern;
    partially etching the first insulating layer pattern to form a second insulating layer pattern enclosed by an outer portion having a step shape; and
    forming a source electrode and a drain electrode electrically connected to the oxide semiconductor pattern, wherein the source electrode and the drain electrode partially contact the second insulating layer pattern and wherein the source electrode and the drain electrode are separated from each other, wherein the outer portion includes a first step and a second step on the first step, and wherein the first and second steps positioned on the oxide semiconductor pattern are covered by the source and drain electrodes and wherein the first insulating layer pattern contacts a to, surface of the oxide semiconductor pattern.

12. The method of claim 11, wherein the first gate insulating layer pattern is a silicon oxide layer.

13. The method of claim 12, wherein the second insulating layer pattern is a silicon oxide layer.

14. The method of claim 13, wherein a thickness of the second insulating layer pattern is less than 3000 Å.

15. The method of claim 11, wherein forming the first insulating layer pattern and forming the first gate insulating layer pattern includes performing a first etching process, wherein
 a halogen carbon compound and oxygen gas are used as a main gas in the first etching process.

16. The method of claim 15, wherein the main gas further includes a halogen-sulfur compound as the main gas, wherein the amount of the halogen-sulfur compound is 20% less than the amount of the halogen-carbon compound and oxygen gas.

17. The method of claim 16, wherein the halogen-carbon compound is $C_4F_8$.

18. The method of claim 11, wherein partially etching the first insulating layer pattern to form the second insulating layer pattern includes
 removing a high-molecule compound formed on a surface of the first insulating layer pattern, wherein the high-molecule compound includes carbon, and
 partially etching the first insulating layer pattern from which the high-molecule compound is removed, and forming a high-molecule compound including carbon on the outer portion.

19. The method of claim 18, wherein removing the high-molecule compound includes performing a second etching process using an inert gas and oxygen as the main gas.

20. The method of claim 18, wherein partially etching the first insulating layer pattern to form the high-molecule compound on the outer portion includes performing a third etching process using the halogen-carbon compound and oxygen gas as a main gas of the third etching process.

21. The method of claim 20, wherein the amount of the halogen-carbon compound supplied for the third etching process is equal to or more than the amount of oxygen gas.

22. The method of claim 21, wherein the halogen-carbon compound for the third etching process is $C_4F_8$.

23. The thin film transistor of claim 1, wherein the first and second steps are formed along an entire outer circumference of the first insulating layer pattern.

24. The thin film transistor of claim 1, wherein the first insulating layer does not include any contact hole.

* * * * *